United States Patent [19]

Kump et al.

[11] 3,814,992

[45] June 4, 1974

[54] HIGH PERFORMANCE FET

[75] Inventors: Herbert J. Kump, Essex Junction; Lloyd M. Lambert, Jr., Hineburg; Robert M. Quinn, Burlington, all of Vt.

[73] Assignee: International Business Machines Corporation, Armonk, N.Y.

[22] Filed: June 22, 1972

[21] Appl. No.: 265,380

[52] U.S. Cl. ................................ 357/23, 357/91

[51] Int. Cl. ............................................ H01c 7/14

[58] Field of Search .................. 317/235, 21.1, 48.9

[56] References Cited

UNITED STATES PATENTS

| | | | |
|---|---|---|---|
| 3,461,361 | 8/1969 | Delivorias | 317/235 |
| 3,513,364 | 5/1970 | Heiman | 317/235 |
| 3,653,978 | 4/1972 | Robinson et al. | 148/1.5 |

OTHER PUBLICATIONS

IBM - Tech. Bulletin - Vol. 15, No. 4, September 1972.

*Primary Examiner*—Rudolph V. Rolinec
*Assistant Examiner*—E. Wojciechowicz
*Attorney, Agent, or Firm*—Howard J. Walter, Jr.

[57] ABSTRACT

A field effect transistor having improved mobility and including an impurity doped surface channel portion containing a controlled amount of impurity opposite to that in the substrate. The devices of the invention are characterized by the provision of a metallurgical junction formed within the normal maximum depletion depth from the insulator-semiconductor interface of a field effect transistor. The built-in electric field, or space charge region, of the junction extends to the interface providing an enhancement mode device. The preferred embodiment includes a step-junction although structures having graded junctions are also disclosed.

10 Claims, 20 Drawing Figures

PATENTED JUN 4 1974 3,814,992

SHEET 1 OF 3

HIGH PERFORMANCE FET

BACKGROUND OF THE INVENTION

This invention relates to improved insulated-gate field effect transistors and more particularly to enhancement devices having improved mobility.

Numerous solid state circuit devices suitable for integrated circuit fabrication have been described in the literature. For example, one such device is the insulated gate field-effect transistor (IGFET) described by Hofstein and Heiman, *Proceedings of the IEEE*, vol. 51, pages 1190–1202, September 1963. Briefly, this type transistor comprises a metallic gate electrode spaced from the surface of a suitably doped semiconductor body of a first conductivity type by a thin dielectric material. Source and drain electrodes are defined by spaced low resistance surface portions of opposite conductivity type in the semiconductor body. An electric field, usually generated by the metallic gate electrode, modulates carrier density along the surface, or conduction channel, between source and drain electrodes. The two basic types of IGFET devices are enhancement and depletion. Enhancement type devices are those in which the channel region between the source and drain is electrically deficient of minority carriers with repect to the bulk and exhibit minimum source to drain conductance at zero gate bias. This condition may be naturally created, for example, by utilizing a uniformly doped *p*-type semiconductor substrate having an n-type source and drain region. Depletion type devices are those having an electrical excess of minority carriers with respect to the bulk in the channel region and exhibit substantial source-drain conductance at zero gate bias. Depletion devices may be created by physically depositing impurities of the same type as the source and drain in the channel region or by electrically inducing a conductive channel through charged species in the insulator. The instant invention, although having some of the basic physical characteristics of a depletion type device, is primarily concerned with enhancement devices exhibiting improved mobility.

DESCRIPTION OF THE PRIOR ART

Although the IGFET competes with bipolar devices on the basis of cost and fabrication simplicity, the IGFET is normally applicable only in relatively low speed circuits due to low carrier mobility in the channel region. Although *n*-channel devices, i.e., those achieving conduction by electrons, exhibit higher carrier mobility than *p*-channel devices, i.e., conduction by holes, effective mobilities achieved by the prior art devices have been disappointing.

Various modifications of the IGFET channel region have been previously suggested in an effort to control device characteristics, particularly threshold voltage. For example, U.S. Pat. No. 3,513,364, to Heiman, suggests that *p*- or *n*-type impurities be diffused into the channel region to form a low resistivity channel thereby modifying the number of free electrons available for conduction. Other modifications such as taught by McCaldin et al., U.S. Pat. No. 3,328,210, and Delivorias, U.S. Pat. No. 3,461,361, teach ionic bombardment of the gate insulator in an effort to provide an induced electrical field in the channel region close to the insulator-semiconductor interface. Fang et al., U.S. Pat. No. 3,417,464, and Becke et al., "Gallium Arsenide MOS Transistors," *Solid State Electronics*, Vol. 8, pages 813–823 (1965) teach diffusion of impurities through an oxide masking layer to achieve impurity pile-up at the interface between insulator and semiconductor in an effort to control device characteristics. Reddi, U.S. Pat. No. 3,296,462, teaches the structure of a depletion type device having an epitaxially deposited, opposite impurity type, layer between the source and drain. The deposited layer has a thickness greater than that of the maximum depletion depth to be expected in normal operation. Other structures for the fabrication of depletion type devices have also been suggested which include the use of diffusion doped or thin epitaxial channel regions apparently terminating within the normal depletion depth. Leith, U.S. Pat. No. 3,413,531, teaches the use of ion implantation techniques to produce oppositely doped implanted channels in depletion type field-effect devices. Arandjelovic, *Proceedings of the IEEE*, January 1970, pages 143–4, teaches that doping of the channel region with impurities of the same types as the substrate at the insulator-semiconductor interface more heavily than the remainder of the substrate may result in increased conductivity of the channel.

All of the above modifications appear to alter the device characteristics by causing a shift in the threshold voltage to allow operation at the various stages between depletion or enhancement mode. Because the impurity profile in these devices essentially is confined to a flattened Gaussian distribution, the general shape of the energy bands in the prior art devices is not altered and the rate of availability of carriers in the channel with increasing gate bias is not improved.

The instant invention overcomes the problems of the prior art structures by providing an enhancement mode IGFET having minimum conductance at zero gate voltage and additionally providing greatly increased carrier mobility.

SUMMARY OF THE INVENTION

The device disclosed herein consists of a field-effect transistor having a channel region which includes a thin surface layer of doped semiconductor material containing the same impurity type as the source and drain regions, i.e., opposite to the semiconductor bulk, and having a steep concentration profile falling within the normal depletion depth to produce a flattening of the energy bands primarily in the vicinity of the insulator-semiconductor interface to provide a broader potential well and increased mobility of carriers particularly at, and just beyond, turn-on.

It is, therefore, an object of this invention to provide increased carrier mobility in field-effect devices.

It is another object to significantly reduce surface scattering and broaden the potential well in IGFET devices.

The foregoing and other objects, features and advantages of the invention will be apparent from the following more particular description of the preferred embodiment of the invention as illustrated in the accompanying drawings.

BRIEF DESCRIPTION OF THE DRAWINGS

FIGS. 6A and B are similar to FIGS. 5A and B and show the log-log plots of channel depth versus excess donor atom concentration for achieving maximum mobility at 4*kt* above turn-on.

DESCRIPTION OF THE PREFERRED EMBODIMENT

Figure 1:
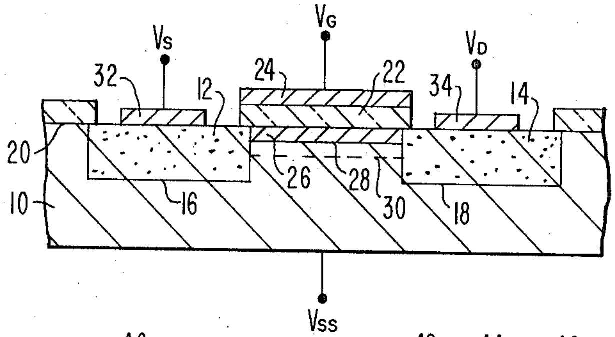
FIG. 1 is a schematic representation of the preferred embodiment in the subject invention and shows the relationship between the oppositely doped channel region and the maximum depletion depth.
Figure 2A:
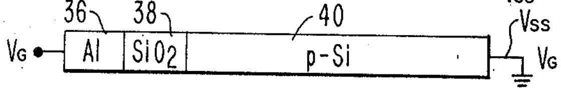
FIGS. 2 and 3 show (*a*) a schematic representation of a section of typical devices in the channel region, (*b*) uncovered lattice charge density at zero gate bias (*c*) electric field distribution at zero gate bias, (*d*) and (*e*) charge and field distribution with applied gate bias and (*f*) potential distribution for a prior art structure and the instant invention, respectively.
Figure 2B:
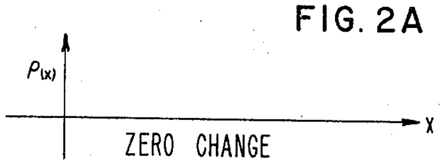

Referring to FIG. 1 there is shown a schematic representation of a preferred embodiment of the instant invention. The embodiment comprises a monocrystaline semiconductor bulk, or substrate, region 10 having a first conductivity type, such as *p*-type conductivity. A low resistivity mono-crystalline semiconductor source region 12 and drain region 14 are formed in spaced relation within the bulk region 10 and form PN junctions 16 and 18 which extend to the surface 20 of bulk region 10. A layer of insulating material 22 extends over the surface of region 10 between source region 12 and drain region 14 and separates metal gate 24 from the surface of region 10. At the interface of surface 20 and insulator 22 there is a mono-crystalline semiconductor region 26 located within bulk region 10 and having the same conductivity type as the source and drain regions and opposite that of bulk region 10. Surface channel region 26 extends to a depth 28 of a magnitude that falls inside of the normal maximum depletion depth 30 capable of being generated by a bias applied to gate 24 under normal operating conditions. Metal contacts 32 and 34 are attached to source and drain regions 12 and 14, respectively. A specific geometry of the device is not critical and, for example, may be linear or circular.

In order to more clearly point out the distinctions between the subject invention and the prior art, a comparison is made in FIGS. 2 and 3. FIG. 2A is a schematic representation of the cross-section of a typical prior art enhancement device taken through the channel region and showing, as an example, an aluminum metal gate 36, silicon dioxide insulator 38 and uniformly doped *p*-type semiconductor bulk region 40. Gate 36 is connected to a potential $V_G$, bulk 40 to a potential $V_{SS}$, at ground. A bias potential $V_{SD}$ is connected between source and drain regions, not shown. FIGS. 2B and C show that lattice charge density, $p(X)$, distribution and electric field $E(X)$ distribution for the prior art device at flatband are both zero, omitting interface charge densities, etc. FIGS. 2D and E show total charge density and field distribution for the same device with an applied gate voltage well beyond turn-on, the initial point of conduction in the channel. The field is a maximum at the insulator semiconductor interface and tends to force carriers in the channel region against the interface where surface scattering significantly reduces carrier mobility. FIG. 2F shows the energy band diagram for the prior art device and shows the relatively narrow potential well constituting the inversion region 41 where carriers are constrained against the surface.

Referring now to FIG. 3 there is shown a simplified schematic of an embodiment of the instant invention which employs a shallow overcompensated surface region in the channel area. FIG. 3A schematically shows a cross-section of the channel region of a field effect transistor including aluminum gate metal 42, silicon dioxide insulator 44, *n*-type semiconductor surface region 46 and *p*-type semiconductor bulk region 48.

Figure 3A:
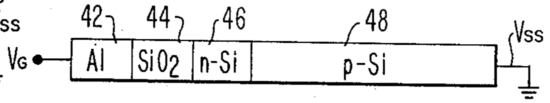
Figure 3B:
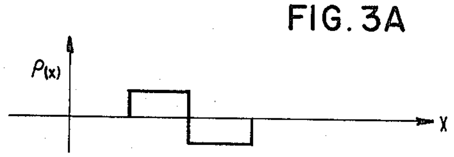
Figure 2C:
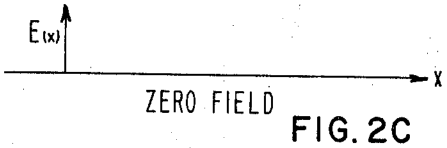
Figure 3C:
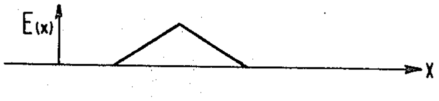
Figure 2D:
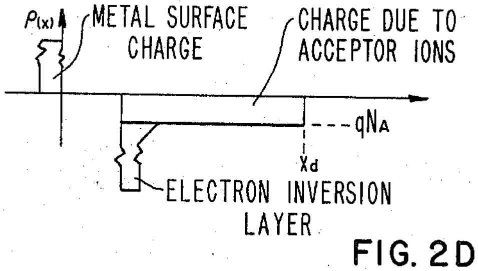
Figure 3D:
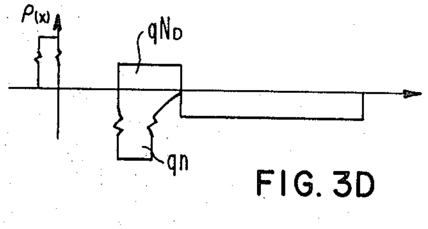
Figure 2E:
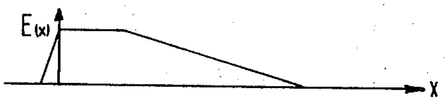
Figure 3E:
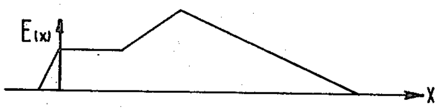
Figure 2F:
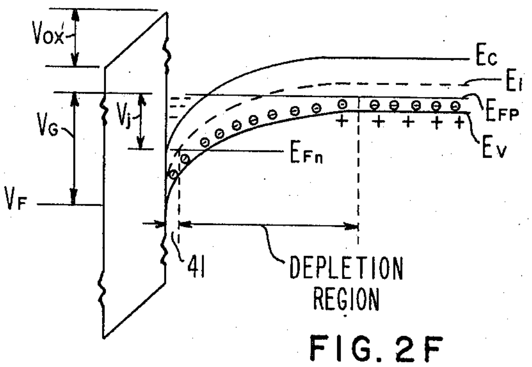
Figure 3F:
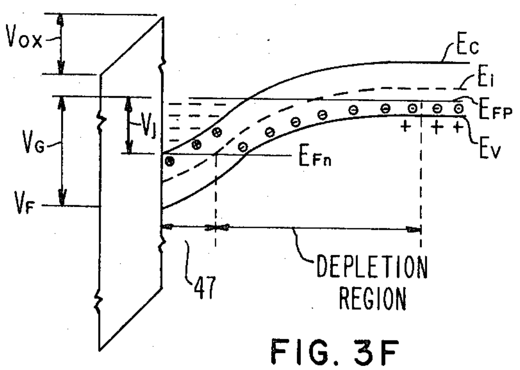

FIG. 3B shows the lattice charge density distribution due to the metallurgical junction formed between surface region 46 and bulk region 48. FIG. 3C shows the built-in field extending to the interface between insulator 44 and oppositely doped region 46 resulting from the space charge region of the junction. FIGS. 3D and E show the charge density distribution and electric field distribution for the same device at a gate bias well in excess of turn-on. The band diagrams shown in FIG. 3F shows the significant flattening or broadening of the potential well 47 compared with the narrow region 41 shown in FIG. 2F. This broadening of the potential well results in an increased mean-charge distance to the surface and hence a reduced scattering of the carriers at the surface.

In order to determine the proper combination of oppositely doped surface region concentration and thickness to provide maximum mobility, i.e., bulk mobility, it was necessary to extend the work of Many et al., *Semiconductor Surfaces*, North Holland Publishing Company, Amsterdam, 1965, chapter 8, pages 304–345, to include an oppositely doped surface region. Utilizing the numerical integrations provided by Many et al. and modifying the carrier densities by a scale factor, S, to account for the oppositely doped surface region, the necessary doping and depth of an oppositely doped surface layer has been determined.

Figure 4:
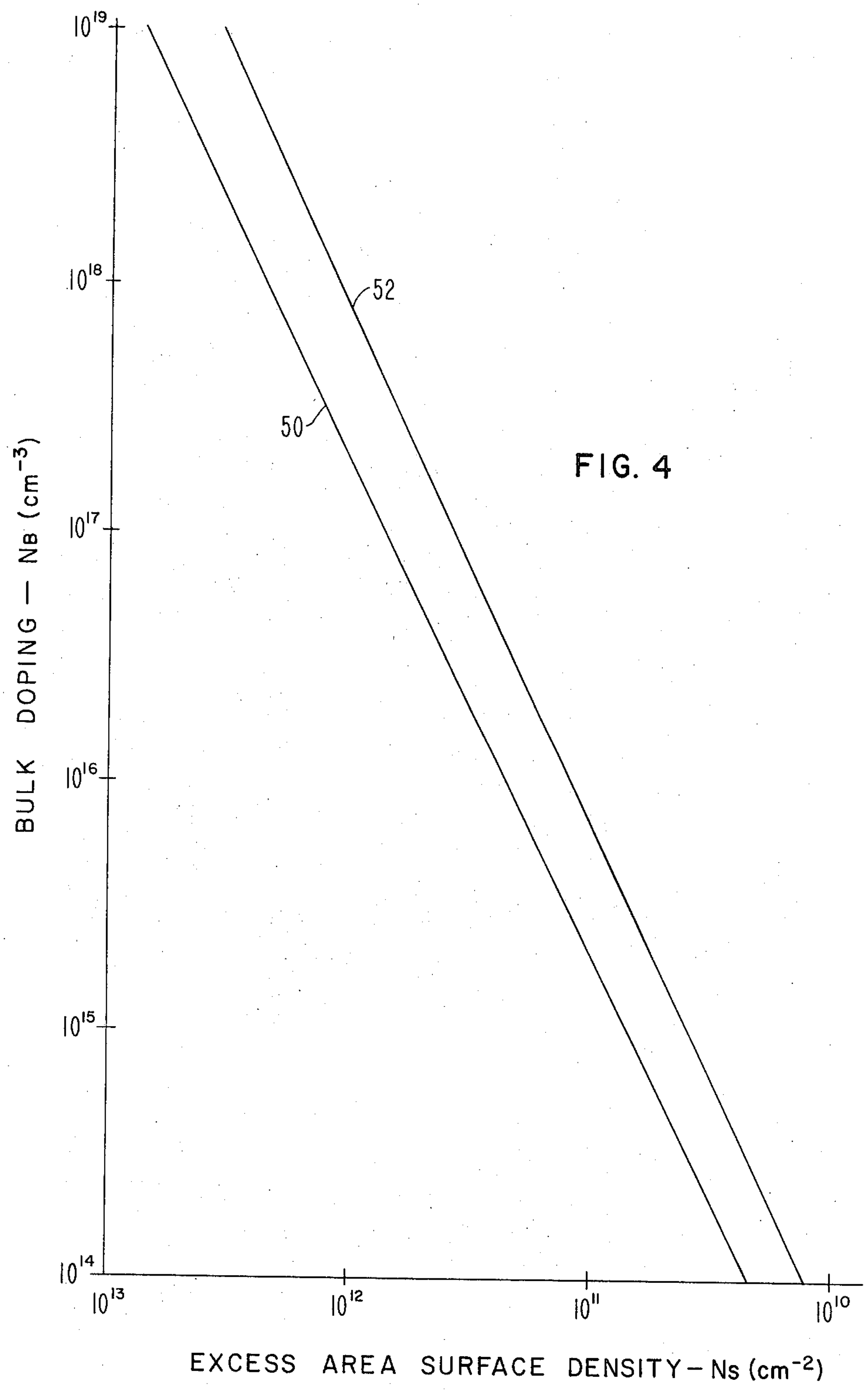
FIG. 4 is a log-log plot of bulk impurity concentration versus excess surface area density of channel impurities for the preferred embodiment at liquid nitrogen and room temperatures.
Figure 5A:
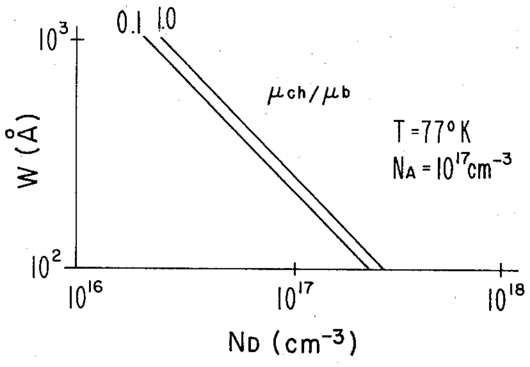
FIGS. 5A and B are log-log plots of oppositely doped channel depth, W, versus excess donor atom impurity concentration for achieving maximum mobility, at the point of turn-on for liquid nitrogen and room temperatures, respectively, utilizing a theoretical step-junction between the channel doping in a substrate containing $10^{17}$ atoms.

Referring now to FIG. 4, there is shown a log-log plot of bulk region doping in carriers per cubic centimeter versus excess area surface density of opposite type impurity necessary to provide bulk mobility in the channel region at room temperature (50) and liquid nitrogen temperature (52). The relationship at room temperature may be expressed as $\log N_S = 2.7 + 0.52 \log N_b$, where $N_S$ is excess surface area density per $cm^2$ and $N_b$ is the bulk doping density per $cm^3$. At various other temperatures appropriate equations may be determined having the form $\log N_S = X + Y \log N_b$, although it is simpler to evaluate points separately as calculated in order to plot the relationship. Once the required surface area density is known it is a straight forward procedure to convert to a volumetric density assuming either a fixed surface layer thickness W, selected over a range of about 100 to 1,000 angstrom units, or a known volumetric density, usually within a magnitude of about ±10 from the bulk doping concentration of donors or acceptors.

In order to simplify calculations, the metallurgical junction between the surface region and bulk is assumed to be a step junction. A procedure to compensate for a more reasonable linearly graded profile such as more nearly achieved with techniques such as ion implantation is described below in connection with an example of the fabrication of a specific embodiment.

From the foregoing, it is evident that the devices of the instant invention are characterized by the provision of a metallurgical junction formed within the normal maximum depletion depth from the insulator-semiconductor interface of a field effect transistor and having an impurity concentration sufficient to cause the space charge region created by the metallurgical junction to substantially contact the insulator-semiconductor interface, thereby closing off the channel against the interface.

In order to provide a specific example of the preferred embodiment of the invention reference will be made to FIGS. 5, 6, 7 and 8.

Figure 5B:
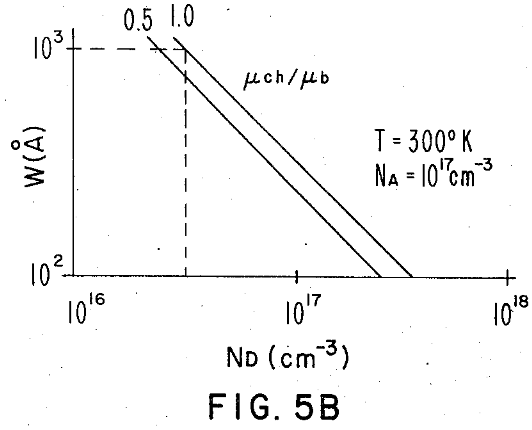
Figure 7:
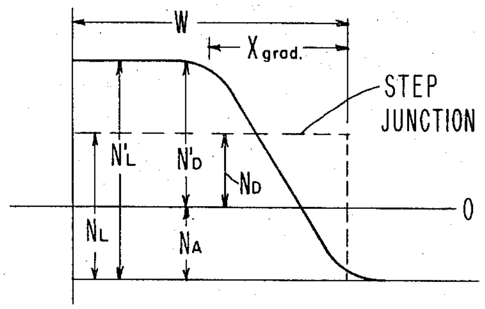
FIG. 7 shows the relationship between oppositely doped channel region thickness, W, for a linearly graded junction, versus impurity concentration, N, having a junction of a graded width, $X_{grad}$.
Figure 8:
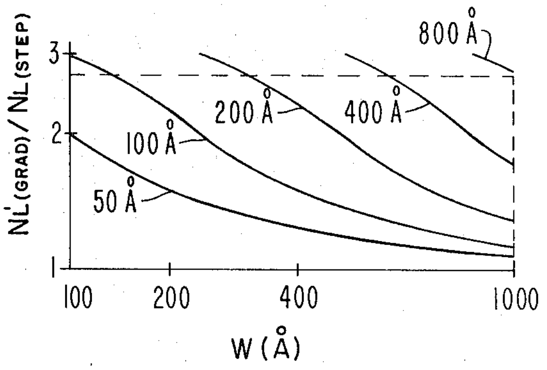
FIG. 8 is a graph showing the relationship between effective excess donor impurity concentration and channel thickness for various junction gradients.

Utilizing a uniformly p-doped bulk semiconductor of about 0.25 ohm-cm resistivity, having an acceptor concentration of $N_A = 10^{17}/cm^3$, and assuming that device operation will be at room temperature (300°K), reference to FIG. 4 indicates that maximum mobility is achieved at turn-on, $\Psi_S = 2\Psi_B$, when a surface area density ($N_S$) of $3.5 \times 10^{11}$ per $cm^2$ excess opposite type impurity atoms are provided in a step junction. Referring to FIG. 5B there is shown a relationship between surface layer thickness (W) versus volumetric density ($N_D$) at room temperature. Arbitrarily chosing W equal to about 1,000 angstrom units results in a requirement for a surface region having an excess donor impurity concentration ($N_D$) of about $3 \times 10^{16}$. Adding this amount to the existing acceptor impurity concentration of $1 \times 10^{17}$ results in the total theoretical over all doping density ($N_L$) necessary to provide the proper excess of donor atoms for optimum mobility and results in a requirement for $1.3 \times 10^{17}$ donor atoms per $cm^3$, for a step junction. Since surface doping techniques such as ion implantation produce a slighty graded junction a correction factor is necessary to allow proper design and fabrication of the device. Referring to FIG. 7, the relationship between the step function doping, $N_L$ and a graded junction, $N_L'$is shown. In order to obtain the same surface potential with the graded junction as with the step junction it is necessary to place additional donor atoms at the surface interface as indicated by $N_L'$. FIG. 8 is a plot of $N_L'$ (grad)/$N_L$(step) versus surface layer depth W. For the above example, using *n*-type impurity arsenic ($As^{75}$) as the doping material a gradient of about 700 angstrom units will result after anneal, it is seen that the $N_L'$(grad)/$N_L$(step) for W equal to 1,000 angstrom units, assuming a gradient of 700 angstrom units, is about 2.5. Therefore, the peak actual added donor atoms necessary to produce maximum mobility is about $3.3 \times 10^{17}/cm^3$. This corresponds to a total per unit area dose rate of $2.1 \times 10^{12}$ atoms per square centimeter.

The following process description illustrates more particularly the fabrication technique for making the preferred embodiment.

Starting with *p*-type silicon wafers having a donor concentration of a $1 \times 10^{17}$ atoms per $cm^3$ and having a surface crystal orientation [100], an initial 6,000 angstrom unit thick layer of thermal oxide is grown using well known oxidation techniques. A masking pattern is applied using standard photo-lithographic techniques to open holes in a thermal oxide over the source and drain regions. Source and drain diffusions may be formed by using, for example, $POCl_3$, $PH_3$ or $AsH_3$, etc., as a dopant source. Diffusion sheet resistance ($\rho_s$) and junction depth ($X_j$) are adjusted to provide specifications required by the circuit desired. Typical parameters are $\rho_s = 15$ ohms per sq. and $X_j = 1$ micron.

A second photolithographic masking technique is used to open gate areas between previously diffused source and drain regions. Gate insulating material is then pyrolytically or thermally grown to the desired thickness. For example, thermal oxidation in dry oxygen 1,000°C for about 50 minutes will provide about 500 angstrom units of oxide.

Channel doping is accomplished perferably by low dose level ion implantation through the gate oxide layer. In order to approach the desired doping profile, the preferred dopant is arsenic ($As^{75}$). Utilizing ion implantation enables the formation of a p-n junction better approaching that of a step junction than other present techniques such as solid state diffusion or epitaxial deposition. Typical process conditions include utilizing 100 Kev arsenic ions implanted at an angle of 7° to the surface normal performed at room temperature. Utilizing a gate oxide thickness of, for example, 500 angstrom units will provide a peak concentration distribution at a distance of about 600 angstrom units below the surface, or about 100 angstrom units below the insulator-semiconductor interface, well within the normal maximum depletion depth. Implanting a dose of $2.4 \times 10^{12}$ atoms per cm. squared, as calculated above, and thereafter annealing at 1,050°C for 10 minutes produces the previously indicated graded junction having an $X_{grad}$ of about 700 angstrom units.

After doping the channel region, a third photolithographic masking step is performed to open contact holes to the source, drain and substrate areas. Blanket metallurgy such as evaporated aluminum is next applied by any standard technique and thereafter photoetched to form the desired metallurgical pattern of electrodes. The wafers are then annealed at 400°C for 20 minutes to form sintered contacts in the source, drain and substrate and to anneal out charge states at the metal-oxide interfaces introduced by deposition of the metal.

The above described process is only representative and is not the exclusive method for fabricating the subject device structure. The ion implantation process is preferred in light of the present state of impurity doping technology.

The technique and structure described may be applied to other surface conduction FET devices with equal improvement in performance.

Figure 6A:
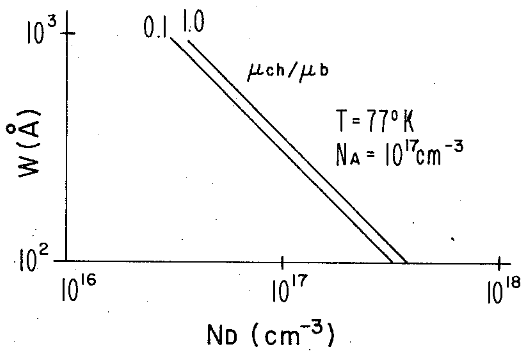
Figure 6B:
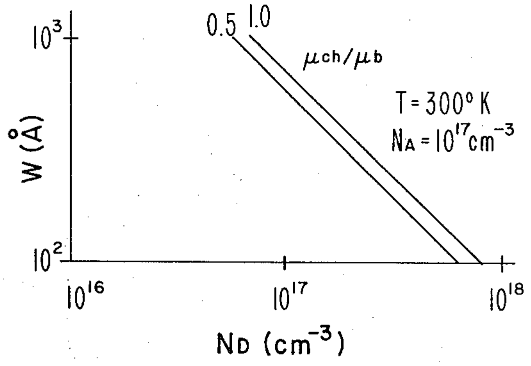

FIGS. 6A and 6B show the surface layer thickness versus excess layer doping density necessary to achieve maximum mobility at $4kt$ beyond turn-on with zero field for both 77° and 300° K. Similar calculations to those referred to above allow conversion and design using a linear graded junction.

Although a *p*-type bulk region and an *n*-type surface region have been shown as a preferred embodiment, the invention is intended also to cover *n*-type bulk and *p*-type surface layers.

In addition, known prior art techniques useful in controlling threshold voltage such as taught by the previously referred to prior art, including the use of substrate bias, may be used in addition to the procedure set out above without destroying the broadened potential well and high mobility effects produced by the instant invention.

While the invention has been particularly shown and described with reference to a particular embodiment thereof, it will be understood by those skilled in the art that the foregoing and other changes in form and details may be made therein without departing from the spirit and scope of the invention.

What is claimed is:

1. A semiconductor device comprising:

a monocrystalline first conductivity type semiconductor bulk region having a first surface;

spaced monocrystalline opposite conductivity type semiconductor source and drain regions located adjacent to said first surface, the portion of said first surface between said source and drain regions defining a channel region;

field applying gate means overlying said channel region and being separated therefrom by an insulating material, said gate means controlling the conductivity of said channel region; and metallurgical junction means in said channel region extending substantially parallel to said first surface for providing a built-in electric field, at zero junction bias, extending from the interface between said channel region and said insulating material to a depth less than the maximum depletion depth capable of being created by said field applying gate means, said field decreasing in magnitude toward said interface and being non-zero at said interface, said electric field providing a deficiency of minority carriers with respect to said bulk region in said channel region and causing said device to exhibit minimum source to drain conductance under zero gate bias.

2. A semiconductor device of claim 1 wherein said bulk region comprises a semiconductor material having a impurity concentration of between $1 \times 10^{14}$ and $1 \times 10^{19}$ atoms per cubic centimeter and the surface of said channel region comprises a semiconductor material providing a surface area concentration of between $1 \times 10^{9}$ and $1 \times 10^{13}$ excess opposite type impurity atoms per centimeter squared.

3. The semiconductor device of claim 1 wherein the maximum magnitude of said built-in electric field is at a depth of from 100 to 1,000 angstrom units from said first surface.

4. The semiconductor device of claim 1 wherein the impurity atom concentrations of said bulk and channel regions are substantially equal.

5. The semiconductor device of claim 1 wherein said metallurgical junction means comprises substantially a step-junction.

6. The semiconductor device of claim 1 wherein said bulk region is *p*-type conductivity silicon.

7. The semiconductor device of claim 6 wherein said channel comprises arsenic doped silicon.

8. The semiconductor device of claim 1 wherein said channel region comprises ion implanted impurity atoms in silicon.

9. The semiconductor device of claim 8 wherein said bulk region is *p*-type conductivity silicon and said channel region comprises ion implanted arsenic atoms in silicon.

10. The semiconductor device of claim 1 wherein the relationship between the bulk region doping density, $N_b$, in atoms per cubic centimeter, and the excess surface area density, $N_s$, in atoms per centimeter squared is, at 300°K:

$$\log N_s = 2.7 + 0.52 \log N_b.$$

* * * * *